(12) United States Patent
Nowak et al.

(10) Patent No.: US 6,528,846 B1
(45) Date of Patent: Mar. 4, 2003

(54) ASYMMETRIC HIGH VOLTAGE SILICON ON INSULATOR DEVICE DESIGN FOR INPUT OUTPUT CIRCUITS

(75) Inventors: Edward J. Nowak, Essex Junction, VT (US); Minh H. Tong, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/404,039

(22) Filed: Sep. 23, 1999

(51) Int. Cl.[7] ............................................... H01L 29/76
(52) U.S. Cl. .................... 257/328; 257/335; 257/339; 257/344; 257/345; 257/347
(58) Field of Search .................................. 257/355, 356, 257/360, 367, 368

(56) References Cited

U.S. PATENT DOCUMENTS

| 4,992,387 A | | 2/1991 | Tamura |
| 5,001,077 A | | 3/1991 | Sakai |
| 5,043,294 A | | 8/1991 | Willer et al. |
| H986 H | | 11/1991 | Codella et al. |
| 5,374,571 A | | 12/1994 | Mukherjee et al. |
| 5,418,394 A | | 5/1995 | Hertrich |
| 5,424,563 A | | 6/1995 | Temple et al. |
| 5,698,869 A | * | 12/1997 | Yoshimi et al. ............. 257/192 |
| 5,834,810 A | | 11/1998 | Schunke et al. |
| 5,936,277 A | * | 8/1999 | Takeuchi ..................... 257/336 |
| 6,063,682 A | * | 5/2000 | Sultan et al. ................ 438/305 |

* cited by examiner

Primary Examiner—Olik Chaudhuri
Assistant Examiner—Wai-Sing Louie
(74) Attorney, Agent, or Firm—Whitham, Curtis & Christofferson, P.C.; Mark F. Chadurjian

(57) ABSTRACT

A silicon on insulation device having halo extensions of source and drain regions and an additional implant for inducing silicon lattice damage is able to withstand high operating voltages. A field lowering Lightly Doped Drain implant and removal of standard damaging source implants decreases avalanche currents and significantly increases drain-to-source breakdown voltage.

11 Claims, 2 Drawing Sheets

ASYMMETRIC HIGH VOLTAGE SILICON ON INSULATOR DEVICE DESIGN FOR INPUT OUTPUT CIRCUITS

BACKGROUND OF THE INVENTION

1. Field of the Invention

The present invention generally relates to semiconductor devices and more particularly to formation of MOSFETs capable of sustaining voltages greater than three volts within a high-performance SOI CMOS technology.

2. Background Description

Silicon on insulator n-MOSFETs, designed for low-voltage, high-performance CMOS circuits, have significant limitations in drain-to-source breakdown voltage (VBDs) due to floating body effects. Because the body of a MOSFET in SOI has no explicit electrical connection available to the circuit designer and hence 'floats', the voltage present on this body will be a function of the use conditions on the gate, source and drain terminals prior to the next use, and is variable and difficult to predict. This leads to (effectively) unpredictable behavior of an SOI MOSFET. In particular, drain avalanche currents forward-bias the body with respect to the source leading to NPN bipolar gain. This results in exponential growth of current from drain to source, thereby limiting the maximum voltage sustainable.

SUMMARY OF THE INVENTION

It is therefore an object of the present invention to provide a silicon-on-insulator device which is able to withstand higher operating voltages than those conventionally attainable.

The extension ion implantations (typically consisting of a shallow n+ high-dose implant, a low-dose higher energy boron halo implant and third implant to induce damage to the silicon lattice at the junction edge, such as germanium or indium) which are implanted into both the source and drains of a conventional MOSFET, are, in this invention, selectively excluded from the drain side of the inventive high-voltage MOSFET by suitable design of the block mask (designated as BH) which is used during these implants. This results in the high values of leakage from the body to the source, but not the drain. The n+ extension implant is responsible for good electrical conductivity between the MOSFET channel (when the device is on) to the deep source and/or drain (n+ or p+ for n-type MOSFETs or p-type MOSFETs, respectively) where contacts are made to interconnects. These deeper junction regions are formed some distance away from the gate to avoid disadvantageous short-channel effects.

A new block mask (designated as SC) is added. This mask provides openings only over the drains of high-voltage MOSFETs, through which a Lightly-Doped Drain (LDD) ion implantation (e.g. Phosphorus at $5 \times 10^{13}$ $cm^{-2}$) is performed, possibly in combination with a light halo (e.g. boron at $1 \times 10^{13}$ $cm^{-2}$ at 35 keV) to control short-channel effects. The LDD is a region of the drain diffusion where the doping is preferably on the order of $10^{17}$–$10^{18}$ $cm^{-3}$ (n-type for nfets, p-type for pfets). This region is immediately adjacent to the channel and below the gate electrode. A phosphorous ion-implantation of dose $\approx 1$–$5 \times 10^{-13}$ $cm^{-2}$ after gate electrode formation (etch) can be used to form this LDD. The LDD lowers the electric fields at the drain and thus lowers the avalanche current substantially. No damage implant is included in this SC opening to keep drain-to-body leakage low.

The invention provides significantly increased drain-to-source breakdown voltage, $V_{BDS}$, by decreasing avalanche currents at the drain both by removal of the standard damaging source implants and by introducing a field-lowering LDD implant at the drain. MOSFETs, and particularly, n-type MOSFETs, are limited in the maximum voltage that may safely be applied from drain to source, Vds-max, by a mechanism known as avalanche breakdown. As Vds is increased, a very high electric field forms in the channel beneath the gate immediately adjacent to the drain junctions. This high field causes a fraction of channel (inversion layer) electrons to create electron-hole pairs in this regions which results in an electric current from the body to the drain (avalanche current). This current draws the body voltage more positive, which in turn, lowers the MOSFET Vt and results in greater channel current which, in turn, results in more avalanche current. At some critical voltage, $V_{BDS}$, this process will run away resulting in damage to the MOSFET or other circuit elements connected to it. Thus, Vds-max is less than $V_{BDS}$ and is directly related to the magnitude of the avalanche currents generated nearby the drain of the MOSFET as well as the ability of the damaged region adjacent to the source to conduct charge to the source from the body.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1A:
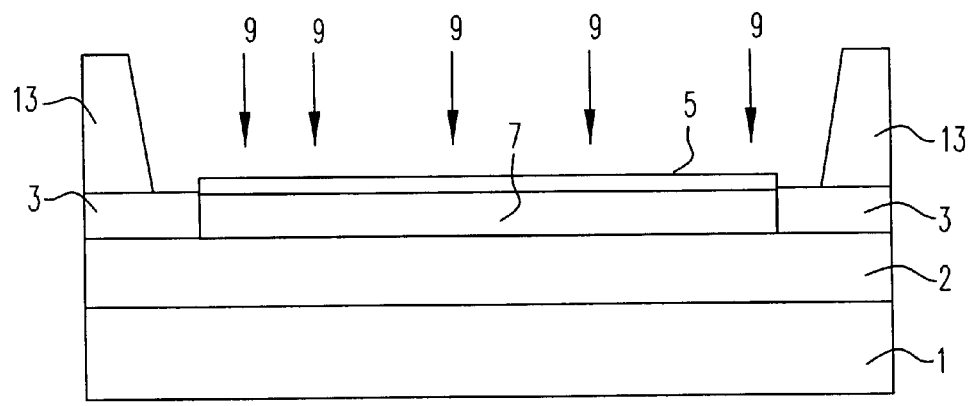
FIGS. 1A, 1B, 1C, 1D, 1E, 1F, and 1G show in cross sectional views the steps of constructing the inventive device.

Referring now to the drawings, and more particularly to FIGS. 1A to 1G, there is shown the steps of forming the inventive asymmetric structure. FIG. 1A shows a cross sectional view of a standard silicon on insulator (SOI) wafer. Shown here is a silicon on $SiO_2$ on silicon substrate. The top silicon 7 is patterned, etched and trench isolation 3 filled. A silicon dioxide layer 2, also referred to as the Bottom Oxide (or BOX) in an SOI wafer, is located between substrate 1 and trench isolation 3, isolating the islands of silicon above from the substrate (silicon) wafer electrically. A thin (about 5 nm) $SiO_2$ layer 5 is grown on 7. An ion implant 9 can then be used to form, for example, a p-well in 7. Then, the resist 13 is stripped.

Figure 1B:
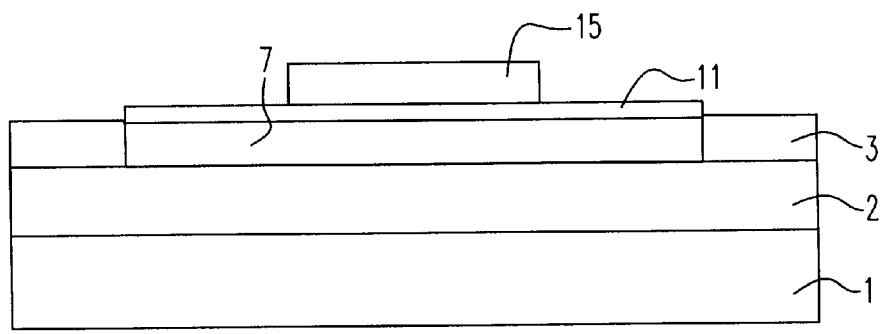

The surface is stripped to silicon again and a thin (5 nm) gate oxide 11 is deposited. As in standard MOSFET practice, the oxide 5 which has been exposed to multiple processing operations and as a result is of poor quality, is stripped to allow regrowth of a high-quality gate oxide immediately prior to gate electrode deposition. Then, as shown in FIG. 1B, gate material 15 is deposited, preferably polysilicon, and patterned to form the gate electrode.

Figure 1C:
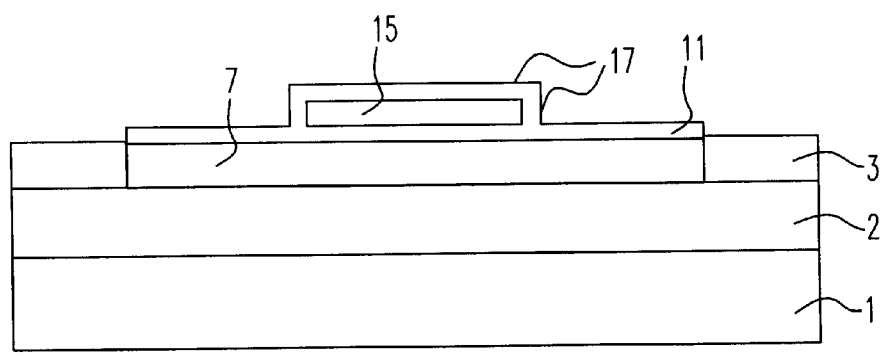

The next step, shown in FIG. 1C, is to grow a thin (3 nm) silicon dioxide layer 17 over the gate electrode 15.

Figure 1D:
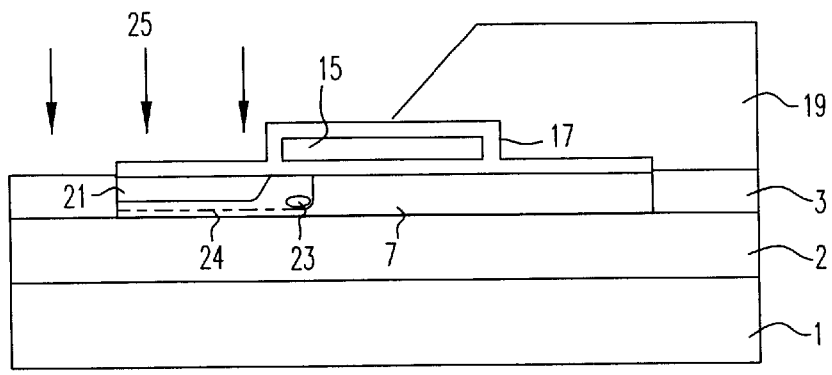

FIG. 1D illustrates an important aspect of this invention. Specifically, a resist 19 is deposited over what will become the drain region of the transistor and is used to prevent implant doping 25 from being implanted in the drain region. Two types of source implants are used. One type provides for what will ultimately become a shallow junction and is indicated by tub region 21. Typically this is created with a moderate dose of n-type ion such as approximately $1\times10^{15}$ cm$^{-2}$ arsenic at 25 keV, and/or a low dose p-type halo implant such as approximately $1\times10^{13}$ cm$^{-2}$ boron; however, other implants could also be used including phosphorous and antimony for the n-type ion and indium for the p-type ion. The main function of region 21 will be to provide a low-resistance, shallow n-type connection from the channel inversion layer to the source of the MOSFET. The other type of implant creates a damage region in the source, the damage region merely being a region that has an altered arrangement from the surrounding crystalline lattice. This damaged region can be viewed as a region where many imperfections have been introduced into the crystalline lattice in order to increase thermal generation currents. The damage region may contain high densities of atomic vacancies, interstitial atoms, and/or crystal dislocations, and this region can be created with a moderate dose of a damaging ion such as germanium at approximately $10^{14}$ cm$^{-2}$ at 40 keV. Other damage ions, such as silicon or indium, could also be used within the practice of this invention. The damage ions implanted through mask 19 create tub region 24; however, FIG. 1e has been drawn to also show operative area 23 to highlight the function of the damage ion. Specifically, damage region 23 serves as a source of hole-electron pairs and creates an electrical connection between the source and the floating body.

The implants may be in common with those used for low-voltage MOSFETs cofabricated on the wafer. Thus, for example, the source of the inventive high-voltage n-MOSFET may use the same ion implantations as the sources and drains of the core, lower-voltage, high-speed logic MOSFETs, also fabricated on the same die and wafer.

Figure 1E:
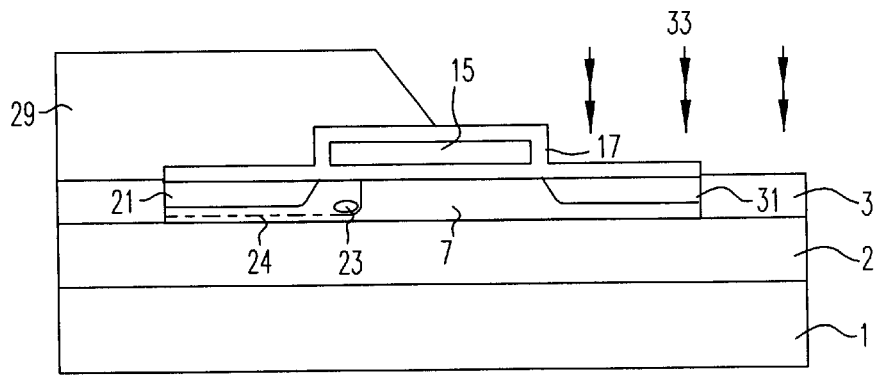

With reference to FIG. 1e, it can be seen that the mask 19 is removed, and a separate implant 33 is performed in the drain region. A portion of the source/drain must be beneath the gate to ensure a low-resistance path from the channel inversion layer of the MOSFET to the source/drain contacts. Furthermore, it is well-known that an insufficient source/drain region beneath the gate leads to premature hot-carrier aging of MOSFETs with use. A lightly doped drain (LDD) lowers the electric field at the drain and thus increases the maximum operating voltage of the MOSFET.

A small extension at the source allows construction of the 'damaged region' 23, 24 in the body adjacent to the source and avoids unnecessary gate-to-source capacitance that a larger extension would add without benefit. Damaged area 23 acts as an electrical connection with the floating body within top silicon 7. While the entire area within dashed line 24 is implanted to create the damage region, the effect for the device is found within damage area 23.

The drain LDD 31 cam be created from, for example, $5\times10^{14}$ cm$^{-2}$ phosphorus at 30 keV and light halo (typically $1\times10^{13}$ cm$^{-2}$ boron at 40 keV). This is accomplished by implanting with ions 33 through openings in mask 29. Other implant ions might also be used within the practice of this invention including indium for the halo and arsenic or antimony for the LDD. Preferably, drain LDD 31 is implanted deeper and further under the gate 15 than source implant 21. The extra length of LDD drain 31 allows for a drop in the field at the drain edge. Phosphorus diffuses rapidly and is ideal for the LDD 31 and gives a deep junction.

After implanting ions 33, the resist 29 is removed and a rapid thermal anneal (typically 1000° C. for 5 seconds) follows.

Figure 1F:
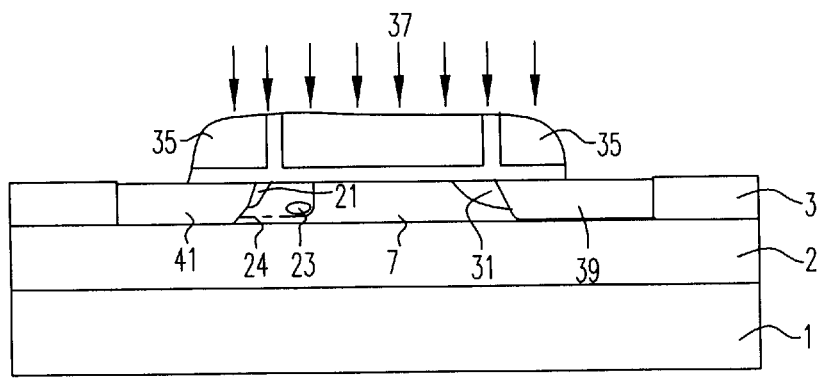

Silicon nitride spacers 35 are deposited and directionally etched, as shown in FIG. 1F. An ion implant 37 to form deep source 41 and drain 39 regions follows. The source 41 and drain 39 regions serve the function of low resistance contacts. An activation anneal (typically 1000° C. for 5 seconds) follows. Remaining SiO$_2$ is selectively etched above the silicon (source, drain, gate) regions.

Figure 1G:
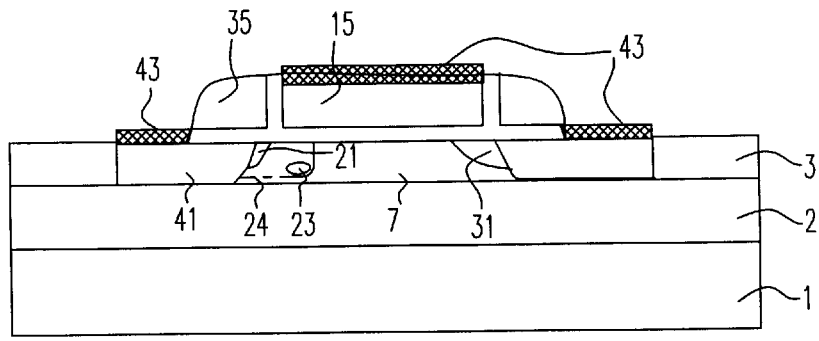

Finally, as shown in FIG. 1G, metal silicide 43, such as cobalt disilicide, is formed selectively over the source, drain and gate regions.

While the invention has been described in terms of a single preferred embodiment, those skilled in the art will recognize that the invention can be practiced with modification within the spirit and scope of the appended claims.

We claim:

1. An asymmetrical MOSFET device comprising:
   a substrate of a first conductivity type;
   a silicon region comprising a floating body positioned in a trench isolation region formed over said substrate;
   a gate formed on said floating body with a pair of sidewalls;
   a source region and a drain region of a second conductivity type disposed within the silicon region and respectively positioned on either side of side gate;
   a lightly doped drain extension of said drain region extending beneath said gate, said lightly doped drain extension being of said second conductivity type and of a lower dopant concentration than said drain region;
   a source extension of said region extending beneath said gate, said drain extension further beneath said gate than said source extension, said source extension being of said second conductivity type; and
   said floating body is a damage region, which comprises a plurality of impurities, said damage region adjacent said source region beneath said gate, said damage region comprising introduced crystalline lattice imperfections in said silicon region of said floating body electrically connecting said source region and said floating body, with said damage region serving as a source of hole-electron pairs.

2. The MOSFET device of claim 1, wherein said floating body is electrically isolated by said trench isolation region.

3. The MOSFET device of claim 1 wherein the damage region is composed of an implant selected from the group comprised of germanium, silicon, and indium.

4. An asymmetrical silicon on insulator device, comprising:
   a silicon on insulator substrate having an upper silicon portion comprising a floating body, having a crystalline configuration, surrounded by isoltation trenches;
   a gate electrode positioned on said upper silicon portion;
   a doped source region formed in said upper silicon portion and a doped drain region formed in said upper silicon portion, said source region comprising a source extension, said doped drain region comprising a drain extension which is larger than said source extension; and
   an electrically active region having a damaged region having a high density of dislocations, interstitial atoms, and/or atomic vacancies within said upper silicon portion positioned between isolation trenches, wherein said damaged region has low resistance and provides an electrical connection between said source region and said floating body, and said damaged region is configured to increase thermal generation currents.

5. An asymmetrical silicon on insulator device as in claim 4, wherein said interstitial atoms are indium.

6. An asymmetrical silicon on insulator device as in claim 4, wherein said interstitial atoms are germanium.

7. An asymmetrical silicon on insulator device as in claim 4, wherein said interstitial atoms are silicon.

8. A silicon on insulator (SOI) transistor device, comprising:
- a silicon wafer;
- an insulator box comprising an isolation trench on said silicon wafer;
- a silicon fill region filling said insulator box;
- a gate positioned on a top surface of said silicon fill region, an area beneath said gate comprising a floating body of said SOI transistor device;
- a source formed in said silicon fill region on a first side of said gate;
- a drain formed in said silicon region on a second side of said gate;
- a source extension contacting said source on a first side and extending beneath said gate;
- a drain extension contacting said drain on a first side and extending beneath said gate further than said source extension; and
- a damage region having low resistance in said silicon fill region adjacent to said source, said damage region provides an electrical connection between said source and said floating body, and said damaged region is configured to increase thermal generation currents.

9. A silicon on insulator (SOI) transistor device as recited in claim 8 wherein said damage region comprises an area having an altered arrangement from a surrounding crystalline lattice of said silicon fill region.

10. A silicon on insulator (SOI) transistor device as recited in claim 8 wherein said insulator box comprises $SiO_2$ and serves to insulate said SOI transistor device from said wafer.

11. A silicon on insulator (SOI) transistor device as recited in claim 8 wherein said source extension and said drain extension have lower dopant concentrations than said source and said drain, respectively.

* * * * *